(12) United States Patent
Khasidashvili et al.

(10) Patent No.: US 7,730,436 B2
(45) Date of Patent: Jun. 1, 2010

(54) VERIFICATION USING SIMULTANEOUS AND INDUCTIVE SAT ALGORITHMS

(75) Inventors: Zurab Khasidashvili, Hertzlia (IL); Alexander Nadel, Haifa (IL); Amit Palti, Ha Solelim (IL); Ziyad Hanna, Haifa (IL)

(73) Assignee: Intel Corporation, Santa Clara, CA (US)

( * ) Notice: Subject to any disclaimer, the term of this patent is extended or adjusted under 35 U.S.C. 154(b) by 869 days.

(21) Appl. No.: 11/554,169

(22) Filed: Oct. 30, 2006

(65) Prior Publication Data

US 2008/0103750 A1 May 1, 2008

(51) Int. Cl.
G06F 17/50 (2006.01)
(52) U.S. Cl. .............................................. 716/5; 716/4
(58) Field of Classification Search ...................... 716/4, 716/5; 703/16
See application file for complete search history.

(56) References Cited

OTHER PUBLICATIONS

Biere A., A. Cimatti, E. Clarke, Y. Zhu, *Symbolic model checking without BDDs, Tools and Algorithms for the Construction and Analysis of Systems*, TACAS 1999.
Biere, A., A. Cimatti, E. Clark, O. Strichman, Y. Zhu, *Bounded Model Checking*, Chapter in Advances in Computers, vol. 58, 2003.
Bryant, R.E., *Graph-based algorithms for Boolean function manipulation*, IEEE Trans. Computers, C-35(8), 1986.
Davis M., G. Logemann, D. Loveland, *A machine program for theorem proving*. In Communications of the ACM, (5):394-397, 1962.
Davis M., H. Putnam, *A computing procedure for quantification theory*, J. ACM, vol. 7, 1960.
Eén, N., N. Sörensson, *Temporal induction by incremental SAT solving*, International Workshop on Bounded Model Checking, BMC 2003.
Fraer, R., S. Ikram, G. Kamhi, T. Leonard, A. Mokkedem, *Accelerated verification of RTL assertions based on satisfiability solvers*, HLDVT, 2002.
Goldberg, E., Y. Novikov, *An efficient learning procedure for multiple implication check*. In Design, Automation, and Test in Europe, 2001.
Gomes C.P., B. Selman, H. Kautz, *Boosting combinatorial search through randomization*, National Conference on Artificial Intelligence, 1998.
Kuehlmann A., M.K. Ganai, V. Paruthi, *Circuit-based Boolean reasoning*, DAC 2001.

(Continued)

*Primary Examiner*—Sun J Lin
(74) *Attorney, Agent, or Firm*—Carrie Boone; Carrie A. Boone, P.C.

(57) ABSTRACT

A simultaneous satisfiability algorithm, or SSAT, allows simultaneous checks to be made efficiently for a number of literals, $x_1, \ldots, x_n$ whether $x_1$ is true under any satisfying assignments of a formula (written in conjunctive normal form) built from the variables of these literals and other variables (or, equivalently whether $x_1$ is a logical consequence of the formula). Thus, several related satisfiability checks are performed simultaneously in SSAT. Temporal induction algorithms allow the verification of the sequential behavior of finite state machines, e.g., hardware. Temporal induction algorithms may employ a SSAT solver to perform simultaneous model checking of several invariant (or safety) properties efficiently. These SSAT-based temporal induction algorithms are double-incremental, such that all learned clauses in the SSAT solver are re-used both across verified properties as well as across time frames.

17 Claims, 14 Drawing Sheets

OTHER PUBLICATIONS

Khasidashvili, Z., M. Skaba, D. Kaiss, Z. Hanna, *Theoretical framework for compositional sequential hardware equivalence verification in presence of design constraints*, ICCAD'04, 2004.

Lynce I., J. Marques-Silva, *Building state-of-the-art SAT solvers*, European Conference on Artificial Intelligence (ECAI), 2002.

Marques-Silva, J.P., K.A. Sakallah, *Robust search algorithm for test pattern generation*, IEEE Fault-Tolerant Computing Symposium, 1997.

Marques-Silva, J.P., K.A. Sakallah, GRASP: *A search algorithm for propositional satisfiability*, IEEE Transactions on Computers, vol. 48, 1999.

McMillan, K.L., *Symbolic Model Checking*, Kluwer, 1993.

Nadel A., *Backtrack search algorithms for propositional satisfiability: Review and Innovations*, Master Thesis, The Hebrew University of Jerusalem, Nov. 2002.

Prasad M., A. Biere, A. Gupta, *A survey of recent advances in SAT-based formal verification*, Int. Journal on Software Tools for Technology Transfer (STTT), vol. 7, No. 2, 2005.

Sheeran, M., S. Singh, G. Stalmarck, *Checking safety properties using induction and a SAT-solver*, FMCAD, 2000.

Strichman, O., *Accelerating bounded model checking of safety properties*, Formal Methods in System Design, vol. 24, 2004.

Zabih R., D.A. McAllester, *A rearrangement search strategy for determining propositional satisfiability*, National Conference on Artificial Intelligence, 1988.

Zhang, L., C.F. Madigan, M.H. Moskewicz, S. Malik, *Efficient conflict driven learning in a Boolean satisfiability solver*. International Conference on Computer-Aided Design (ICCAD'01), 2001.

Whittemore, J., K. Kim, K. Sakallah, *SATIRE: A new incremental satisfiability engine*, DAC, 2001.

Jun Gu, Paul W. Purdom, John Franco, Benjamin W. Wah, *Algorithms for the satisfiability (SAT) problem: A survey*, DIMACS Series in Discrete Mathematics and Theoretical Computer Science, 1996.

VERIFICATION USING SIMULTANEOUS AND INDUCTIVE SAT ALGORITHMS

TECHNICAL FIELD

This disclosure relates to formal design verification and, more particularly, to satisfiability algorithms.

BACKGROUND

Design verification is increasingly recognized as a bottleneck in the design cycle. Formal verification allows finding design bugs in the early stages of design. Preferably, the formal verification is capable of fully proving the correctness of the design.

A Boolean decision procedure is found at the core of most verification algorithms. The most scalable and fastest among Boolean decision procedures are so-called satisfiability checking (or SAT) algorithms.

A classical satisfiability algorithm, known as a DPLL algorithm (short for the Davis-Putnam-Logemann-Loveland algorithm), takes as input a Boolean formula, f, and decides whether there is a truth assignment to variables of f that makes f evaluate to true. The formula, f, is represented in a special form, known as conjunctive normal form, or CNF.

A system under test, such as hardware, is in transition over time. The transition system is assumed to have an initial state corresponding to time zero. At every interval, such as a clock tick, the state of the system changes according to a transition relation. The state change describes how the system transitions from state to state.

The transition system may thus be characterized as having a set of states, a sub-set of initial states, and a transition relation. The transition relation determines how the transition system may transit from one state to the next, and may be characterized mathematically as a set of state pairs, for example, $(s_1, s_2)$. The initial state relation defines what states the transition system may be in at time zero. In the transition systems discussed herein, states are given as truth assignments to a fixed number of Boolean variables (these Boolean variables represent the state elements of the hardware). The terms "transition system" and "finite state machine" (or FSM) are used herein interchangeably.

Bounded model checking (BMC) is a SAT-based verification technique used for finding counter-examples (CE) to a given safety property in a transition system. A safety property is a particular Boolean formula, P, in the system that is supposed to be true for all possible scenarios of the system. For a given transition system, C, a safety property, P, is valid if, for all reachable states, s, of the system, C, s(P)=true. Here, the reachable states of the system are the states into which the transition system can transition (from an initial state) in zero or more steps. (The safety properties discussed herein are limited to properties known as invariants.)

The idea of BMC is to unroll the transition system to k time steps, and search using a SAT solver for a state transition path of length less or equal to k, starting with an initial state and ending in a state violating the property. "Unrolling the transition system to k time steps" refers to obtaining a description of the system from time zero to time, k, in other words, building a sequence of states, $s_0, s_1, s_k$, where state, $s_l$, describes the transition system at time, l. The sequence $s_0, \ldots, s_k$ is referred to herein as a state transition path of the transition system. The methods described herein are designed to analyze state transition paths.

A SAT solver searches for a satisfying assignment to a Boolean formula written in conjunctive normal form (CNF).

A CNF formula is represented as a set of clauses, a clause being a disjunction of literals, where a literal is a Boolean variable or its negation. A SAT problem may be represented using n variables, $x_1, x_2, \ldots, x_n$, which may be assigned truth values, 0 (false) or 1 (true). A literal is a variable, $x_l$, or its negation, $\neg x_l$.

The CNF formula operated upon by the SAT solver is known as a SAT instance or a CNF instance. The SAT solver looks for a satisfying assignment of the SAT instance.

Proving a safety property, P, using the BMC technique means showing that there is no counter-example (CE) to P of a length less than or equal to the diameter of the system, i.e., the maximum length of a shortest (thus loop-free) path between any two states.

Practically speaking, BMC is an incomplete technique. BMC is rarely capable of proving a property arising from an industrial application of software or hardware verification. This is because the diameter for such systems is too large to handle by current SAT solvers. One solution to the BMC problem is a technique employing temporal induction.

A temporal induction algorithm proposes unrolling the transition system to depths lower than the diameter of the system. Roughly, BMC in the algorithm corresponds to the base of induction. The induction step, at depth m, attempts to prove that there is no state transition path, $s_0, \ldots, s_m, s_{m+1}$ such that P holds in all but the last state ($s_0$ need not be an initial state). Once such a depth, m, is found, and it has been shown in the base of induction that there is no counter-example, CE, to the property of length m or less, the property P is proven valid at all states reachable from the initial stats.

In a BMC run, to avoid unnecessary unrolling of the transition relation, one starts with low bounds, k, if no counter-example, CE, is found for the property of length smaller than or equal to k, the bound, k, is increased, repeatedly, until k reaches the diameter of the transition system, A BMC run thus involves a number of calls to the SAT solver. Similarly, proving the induction step in the algorithm involves several calls to the SAT solver, one for each increase of k as k approaches m. The distinct calls to the SAT solver are closely related.

BRIEF DESCRIPTION OF THE DRAWINGS

The foregoing aspects and many of the attendant advantages of this disclosure will become more readily appreciated as the same becomes better understood by reference to the following detailed description, when taken in conjunction with the accompanying drawings, wherein like reference numerals refer to like parts throughout the various views, unless otherwise specified.

DETAILED DESCRIPTION

In accordance with the embodiments described herein, a simultaneous satisfiability algorithm, known herein as a SSAT algorithm, is disclosed. The SSAT algorithm allows simultaneous checks to be made efficiently for a number of literals $x_1, \ldots, x_n$, whether $x_l$ is true under any satisfying assignments of a CNF formula built from the variables of these literals and other variables (or, equivalently whether $x_l$ is a logical consequence of the CNF formula). Thus, several related satisfiability checks are performed simultaneously.

Further, SSAT-based temporal induction algorithms are disclosed. The temporal induction algorithms allow the verification of the sequential behavior of finite state machines, e.g., hardware. The proposed algorithms employ a SSAT solver for performing simultaneous model checking of several invariant (or safety) properties efficiently. In contrast to prior art SAT solvers, the SSAT-based temporal induction algorithms are double-incremental, such that all learned clauses in the SSAT solver are re-used both across verified properties as well as across time frames.

In the following detailed description, reference is made to the accompanying drawings, which show by way of illustration specific embodiments in which the disclosure may be practiced. However, it is to be understood that other embodiments will become apparent to those of ordinary skill in the art upon reading this disclosure. The following detailed description is, therefore, not to be construed in a limiting sense, as the scope of the present disclosure is defined by the claims.

The Basic DPLL Algorithm in Modern SAT Solvers

During SAT analysis, the CNF formula is examined, and conflict clauses are learned. More precisely, during a SAT search, a procedure called Boolean constraint propagation, (or BCP), may force conflicting assignments to a literal, and a conflict clause is a result of an analysis aiming at resolving the conflict. Conflict clauses are themselves written in CNF form, and are clauses that prevent the conflict from recurring in a subsequent search.

A CNF formula may have many logical consequences. A logical consequence of a formula, f (whether in CNF form or not), is any formula, g, such that f→g is a valid formula. In other words, f logically implies g or g is a logical consequence of f. (Not all logical consequences are clauses that are learned during a SAT search.) All conflict clauses learned during a SAT search are logical consequences of the CNF formula.

Figure 1:
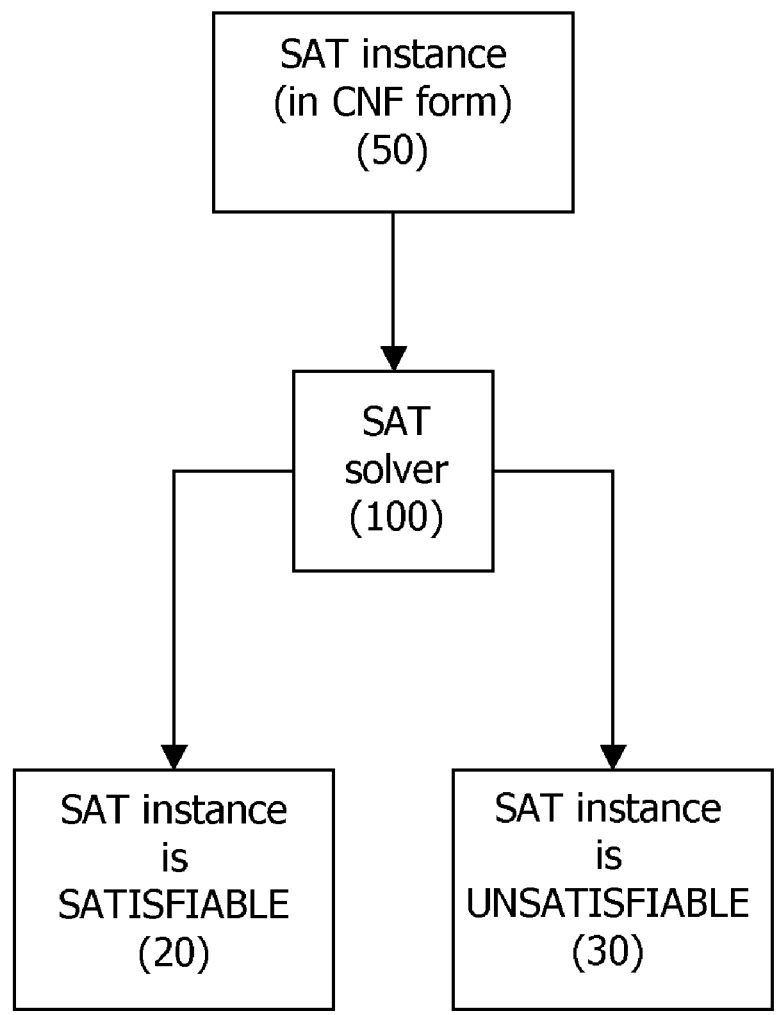
FIG. 1 is a block diagram of a SAT solver, according to the prior art.

The DPLL algorithm is the basic backtrack search algorithm for SAT. Modern SAT solvers enhance the DPLL algorithm by so-called Boolean constraint propagation (BCP), conflict driven learning, and search restarts. FIG. 1 is a simple block diagram of a SAT solver 100, according to the prior art. The SAT solver 100 receives as input a formula, a SAT instance 50, written in CNF form, and generates one of two solutions, that the SAT instance is satisfiable 20 or is unsatisfiable 30.

Figure 2:
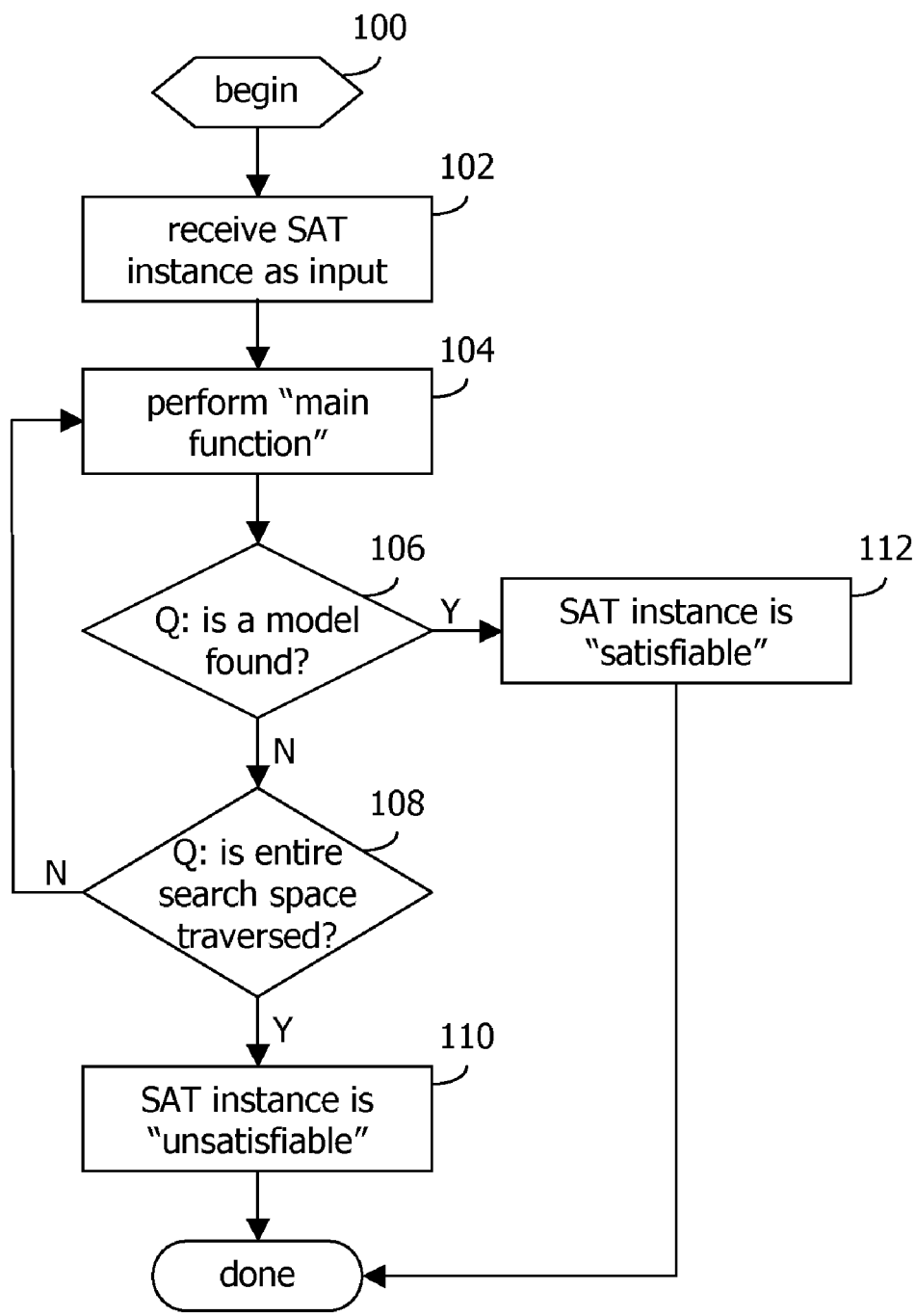
FIGS. 2 and 3 are flow diagrams depicting operations performed by the SAT solver of FIG. 1, according to the prior art.
Figure 3:
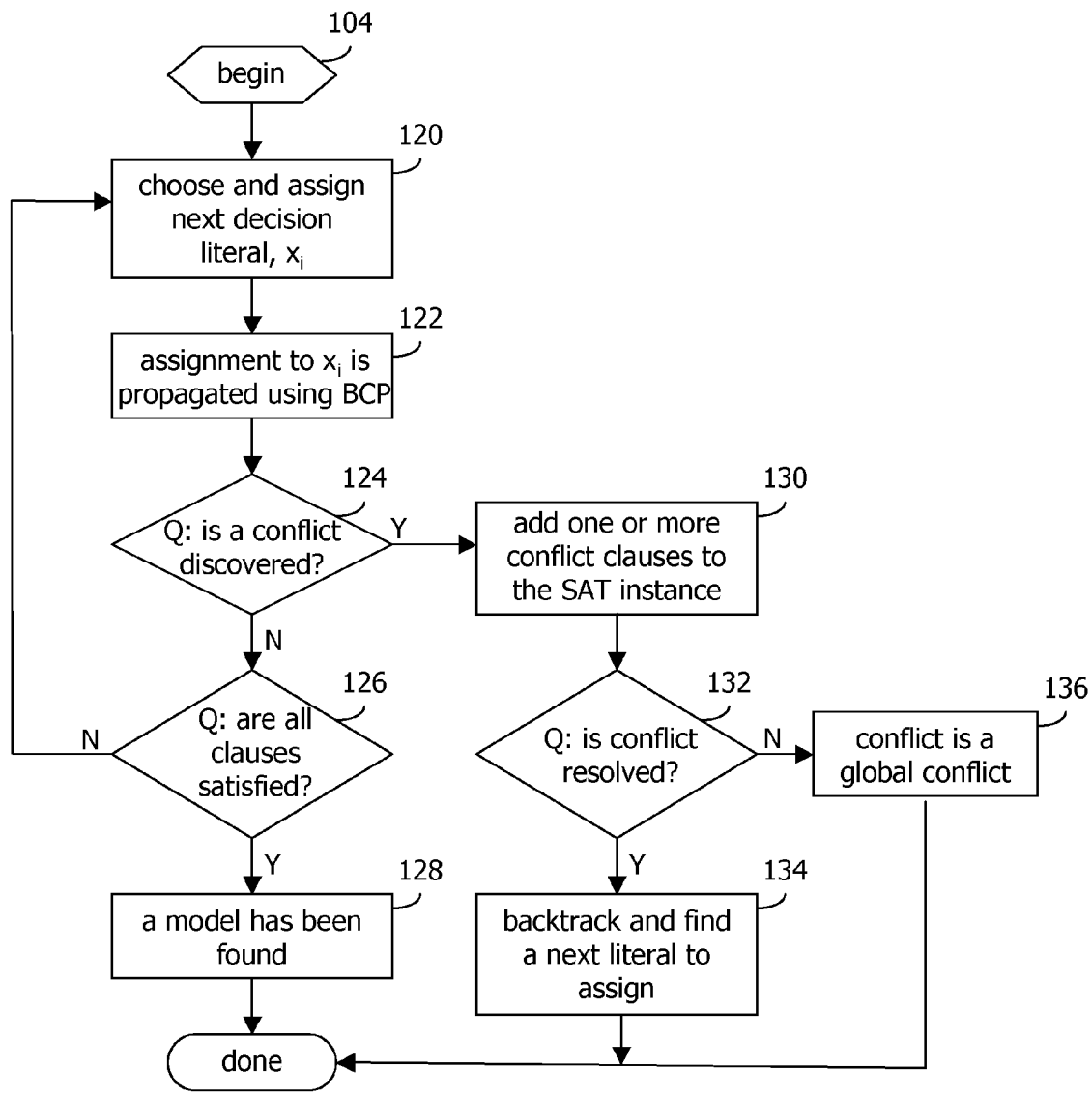

FIGS. 2 and 3 are flow diagrams depicting operations performed by the SAT solver 100 of FIG. 1, according to the prior art. The SAT solver 100 receives as input a CNF formula, the SAT instance 50 (block 102). The SAT instance 50 is represented as a set of clauses, each clause being a disjunction of literals, where a literal is a Boolean variable or its negation. As the SAT solver 100 analyses the SAT instance 50, a binary search tree of the SAT instance is generated.

Once the SAT instance 50 is received, the SAT solver 100 performs a "main function," a set of operations that includes Boolean constraint propagation (BCP). The "main function" is described further in FIG. 3. As the loop in FIG. 2 shows, the execution of the main function, including BCP analysis, may be performed repeatedly, until either an assignment satisfying all the clauses is found, known as a model, or no model may be found, in which case the SAT instance 50 is deemed "unsatisfiable." When a model is found (block 106), the SAT instance 50 is deemed "satisfiable" (block 112). In the alternative, the SAT solver 100 explores the entire search space and finds no model (blocks 106 and 108), in which case the SAT instance is unsatisfiable (block 110). Some of the variables in a model may be "don't cares," meaning that any assignment to these variables nevertheless yields a model of the SAT instance 50.

The "main function" is executed (block 104), as described further in FIG. 3. At each node of the search tree the SAT solver 100 performs the following steps:

(1) The SAT solver 100 chooses and assigns the next decision literal, $x_l$, (block 120) and propagates its assignment (the literal, $x_l$, is assigned a truth value, either "true" or "false") using BCP (block 122), BCP identifies unit clauses and repeatedly applies the unit clause rule. A unit clause is a clause having all but one literal assigned "false," while the remaining literal, l, is unassigned. To satisfy the SAT instance 50, the unassigned literal, l, is assigned the value "true." This operation is often referred to as the unit clause rule. Where the literal, l, is "true" is referred to as an implied assignment.

The unit clause rule is applied repeatedly, until either no more unit clauses exist, or a variable exists that must be assigned both false and true in two different unit clauses, in which case a conflict is discovered (block 124). If no conflict is discovered, the SAT solver 100 checks whether all the clauses are satisfied (block 126). If all clauses are satisfied, a model has been found (block 128) and the formula is said to be satisfiable (FIG. 2, block 112). Otherwise, the SAT solver 100 is looking for the next decision literal (block 120).

(2) If a conflict is discovered (block 124), the SAT solver 100 adds one or more conflict clauses to the SAT instance 50 (block 130). A conflict clause is a new clause that prevents the set of assignments that lead to the conflict from reappearing during a subsequent search. By adding the conflict clause to the SAT instance 50, the conflict will not be "rediscovered" during subsequent analysis. Then, if a literal, y, exists such that it is sufficient to flip its value in order to resolve the conflict, the "main function" backtracks and flips the truth assignment of y, e.g. if y is "false," then y becomes "true" (block 134). If no such literal exists (block 132), the formula is "unsatisfiable" (FIG. 2, block 110). The former case is referred to as a local conflict and the latter case is referred to as a global conflict (block 136).

During conflict analysis, one or more literals, $x_l$, may be discovered to be globally true. That is, the one or more literals are assigned the value "true," independent of other variable values. This happens when a new conflict clause containing exactly one literal, l, is learned. The literal, l, as well as all the literals assigned as a result of BCP following the assignment, l=true, are globally true.

(3) Once the "main function" is complete (FIG. 3), the SAT solver 100 may restart the search by un-assigning all but the globally valid literals, keeping all or some of the learned conflict clauses found since the previous restart (if any). Once either a model is found (block 106) or the entire search space has been traversed with no model being found (block 108), the analysis of the SAT solver 100 is complete.

Another proposal is to re-use pervasive learned conflict clauses across consecutive calls to the SAT solver. Here, pervasive conflict clauses are the conflict clauses that are logical consequences of all the involved SAT instances. The pervasive learned conflict clauses may be added to the clause set permanently.

Still another approach is to combine the induction method and the re-use of pervasive learned conflict clauses method. In such an approach, an interface to a SAT solver enables incremental BMC and induction schemes where all conflict clauses are pervasive and may be re-used.

SSAT Implementation within a DPLL-based SAT Solver

Figure 4:
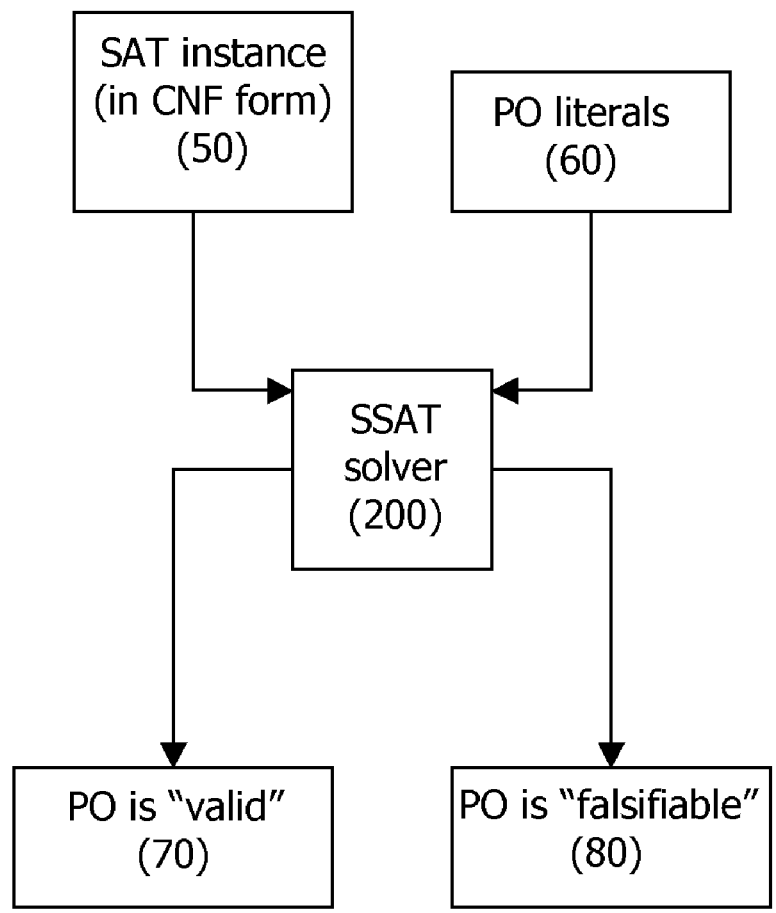
FIG. 4 is a block diagram of an SSAT solver, according to some embodiments.

A simultaneous propositional satisfiability algorithm (SSAT) is described in FIG. 4, according to some embodiments. In addition to the SAT instance 50, a SSAT solver 200 receives as a parameter a list of proof objective (PO) literals 60, or simply, POs. Following execution of the SSAT solver 200, each of the POs 60 is either proven "valid" 70 or "falsifiable" 80. The variables of the PO literals occur (positively or negatively) in the SAT instance 50.

The SAT instance includes many literals that make up the clauses of the instance. The SSAT solver 200 analyzes some, but not all of the literals, the ones known as POs 60. For each PO, the SSAT solver 200 proves or disproves that the PO is a logical consequence of the SAT instance 50: the PO is a logical consequence of the SAT instance if and only if, for all truth assignments to the variables in the SAT instance, whenever the SAT instance 50 evaluates to "true" (that is, the SAT instance is "satisfied"), the PO is assigned "true."

At the beginning of the operation of the SSAT solver 200, all POs are unresolved "Resolving a PO" means finding out whether the PO is "falsifiable" or "valid," POs are concluded to be "falsifiable" when found to have the value "false" in a SAT assignment to the CNF instance 50. A PO is deemed "valid" if there is no SAT assignment to the CNF instance where the PO is assigned "false." At the end of the SSAT solver operation, all POs are resolved; their status is either "valid" 70 or "falsifiable" 80.

One way to implement SSAT is to perform the following steps:

(1) proceed with a regular DPLL-based search;
(2) when a model is discovered, mark all the POs that are assigned "false" in the model as "falsifiable";
(3) as soon as all the search space is explored, mark all the unmarked POs "valid" and exit.

Using such an approach, the number of models may be very large. Therefore, it is inefficient to visit each model during the search. Moreover, if a SAT solver uses search restarts (as do most of the state-of-the-art solvers), the algorithm may not finish, since the same models may be rediscovered after each restart. One solution may be to add clauses so as to prevent the rediscovery of each model, but this may lead to memory explosion.

The SAT solver learns conflict clauses. Recall that a conflict clause is a clause that prevents the conflict identified during analysis of the CNF formula, the SAT instance, from recurring. A conflict clause may be of length one, including a single literal. If a PO happens to be the learned literal, the PO may be declared "valid." The learned conflict clauses are logical consequences of the SAT instance. Thus, where it is the learned literal, the PO is a logical consequence of the SAT instance, which makes the PO "valid."

Figure 5:
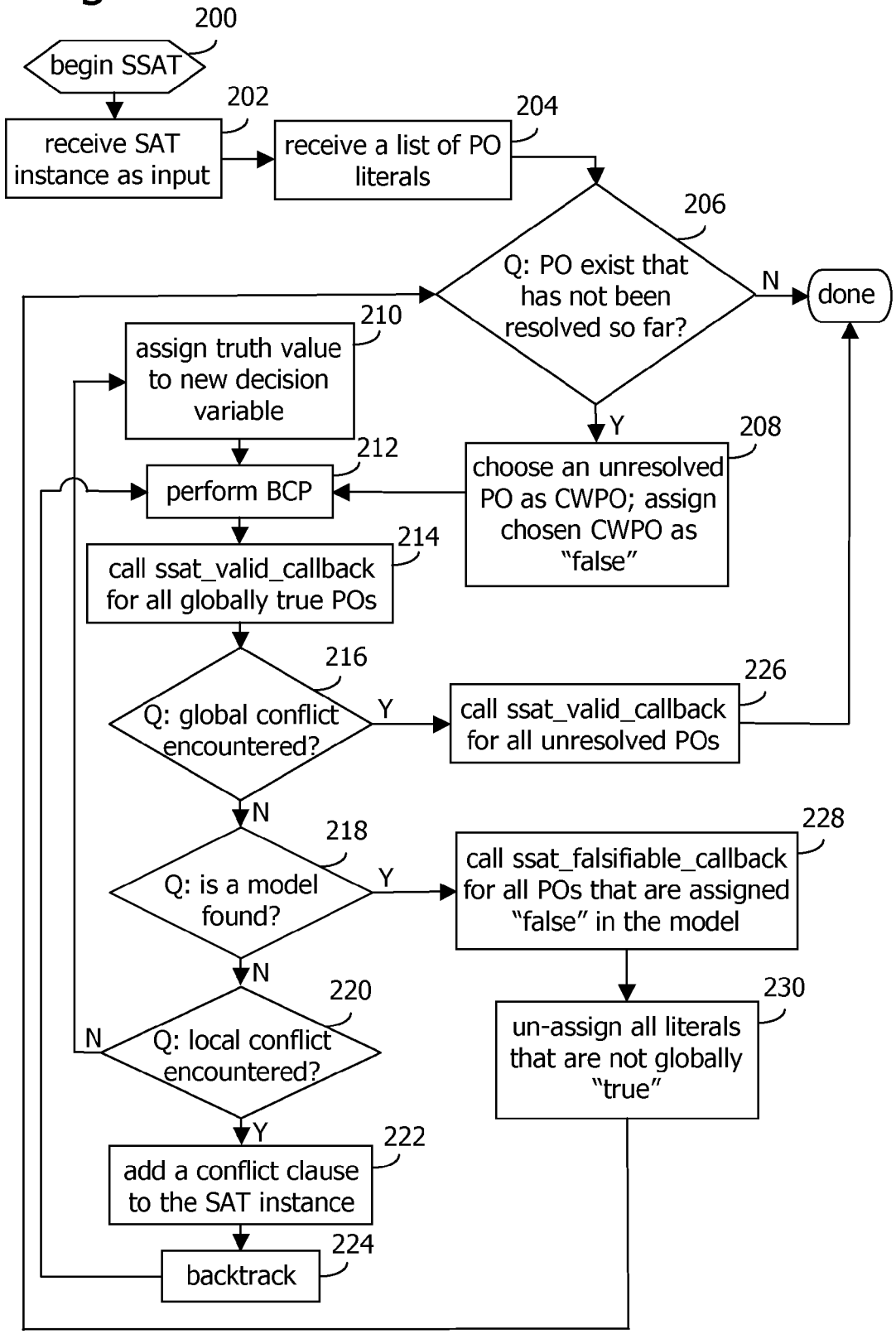
FIG. 5 is a flow diagram depleting operations performed by the SSAT solver of FIG. 4, according to some embodiments.

In FIG. 5, a flow diagram is depicted, describing operations of the SSAT solver 200 of FIG. 4, according to some embodiments. In addition to receiving the SAT instance 50 as an input (block 202), the SSAT solver 200 receives a list of PO literals 60 (block 204). As long as a PO exists that has not been resolved so far (block 206), a new PO literal is defined, known as a currently watched proof objective (CWPO) literal, or CWPO. The SSAT solver 200 maintains the CWPO as a PO literal to be "falsified." Thus, the SSAT solver 200 assigns the PO literal the value "false." The CWPO may be any unresolved PO (block 208).

The CWPO ceases to be the currently watched PO under two circumstances. First, when a model containing "CWPO=false" is discovered, the CWPO, as well as the POs 60 that are assigned the value "false" (or are "don't care" literals) in the model, are marked as "falsifiable." Second, when the CWPO is discovered to be globally "true" the CWPO, as well as other globally valid POs (if any) are marked as "valid." Recall that a literal is deemed "globally true" if assigned "true" independent of other variables.) On both occasions, a check is made whether there exists a PO, l, that has not been discovered "valid" or "falsifiable," in which case the CWPO is set to l. Otherwise, the algorithm halts.

Thus, in FIG. 5, once the CWPO has been assigned (block 208), BCP operations are performed (block 212). Following BCP, all globally true POs are declared "valid" by executing ssat_valid_callback (block 214). The procedure, ssat_valid_callback, is a procedure that declares/reports a PO as "valid." The usage of a callback routine is one way of describing and implementing the algorithm. Software programmers of ordinary skill in the art may recognize other approaches to declaring all globally true POs as "valid."

The SSAT solver 200 next determines whether a global conflict has been encountered (block 216). If so, the callback routine, ssat_valid_callback, is executed for all unresolved POs (block 226), and the algorithm is complete. Otherwise, the SSAT solver 200 ascertains whether a model has been found (block 218). If so, the SSAT solver 200 executes the callback routine, ssat_falsifiable_callback, for all POs that are assigned "false" in the model (block 228). Further, all literals in the SAT instance 50 that are not globally "true" are un-assigned (block 230). Again, a determination is made whether a PO exists that has not been resolved (block 206), and the process is repeated, as described above. Again, the use of callback routines to report POs as "valid" or "falsifiable" is but one of several ways in which such reporting may be conducted.

Where no global conflict has been encountered and no model has been found, the SSAT solver 200 ascertains whether a local conflict has been encountered (block 220). If so, the SSAT solver 200 adds a conflict clause to the SAT instance 50 (block 222). The algorithm backtracks (block 224)—some of the assigned variables are unassigned. The SSAT solver 200 again performs BCP (block 212) and the process is repeated, as described above. If, instead, no local conflict is encountered, a troth value is assigned to a new decision variable (block 210), and the process is repeated, as indicated in FIG. 5.

The algorithm employed by the SSAT solver 200 ensures that the number of models is less than or equal to the number of POs. (Since the number of CWPOs is less than or equal to the number of POs, the number of discovered models will also be less than or equal to the number of POs.) The algorithm also ensures that a model is not rediscovered, even where search restarts are used. After encountering a model, the SSAT solver 200 chooses a CWPO that has not been "false" under any previous model, and assigns the CWPO the value "false." These steps ensure that any model will be different from all the previously discovered models. Further, the SSAT solver 200 ensures that every PO is visited during each new CWPO selection. Thus, each PO is marked "valid" or "falsifiable" after the SSAT solver 200 terminates.

The SSAT solver 200 is presented in the following pseudo-code, according to some embodiments:

```
SSAT ([PO_1,...,PO_n], cnf_instance) {
  while (1) {
    if (all the POs are valid or falsifiable) Return;
    CWPO = any PO literal that is neither valid nor falsifiable;
    Assign CWPO = false;
    do {
      status = BCP( );
      Mark any PO literal that is discovered to be globally true as valid;
      if (status == global_conflict) {
        Mark all unmarked PO literals valid; Return;
      }
      if (status == model) {
        Mark any falsified and don't care PO literals falsifiable;
        Unassign all the literals that are not globally true;
      }
      if (status == local_conflict) {
        Add a conflict clause;
        Backtrack;
      }
      else {
        Assign choose_decision_literals( );
      }
    } while (status == local_conflict);
  }
}
```

In contrast to the SAT solver 100, the SSAT solver 200 is answering a different question. The SAT solver 100 exits as soon as a model is found, such that the given CNF formula is deemed "satisfiable;" where no mode is found, the CNF formula is "unsatisfiable." POs are not a part of the SAT solver analysis. The SSAT solver 200 resolves every PO, whether "valid" or "falsifiable," usually by obtaining several satisfying assignments. For each PO, the SSAT solver 200 checks whether the PO is a logical consequence of the SAT instance 50.

Methods for Simultaneous Bounded Model Checking and Induction

Recall that bounded model checking (BMC), while being a theoretically complete algorithm for model checking of safety properties, is an incomplete technique for analyzing transition systems arising from industrial hardware designs, due to the excessive complexity of such systems. BMC involves unrolling the transition system to k time steps, and searching using a SAT solver for a state transition path of length less than or equal to k, starting with an initial state and ending in a state violating the property. Induction improves on the method of BMC, by unrolling the transition relation to depths lower than the diameter. Induction includes a base part (similar to the BMC method) and a step part. Using induction, the SSAT algorithm 200 may be executed for simultaneous model checking of multiple safety properties.

The proof objective (PO) literals, or POs, described above, are some of the literals whose corresponding variables are making up the SAT instance 50. However, not all of the literals of the SAT instance are to be analyzed in the SSAT algorithm. It is the induction algorithm, executed prior to initiating the SSAT solver 200, that determines which of the literals are to be analyzed as POs.

In describing induction, path($s_0, \ldots, s_k$), base(P,k), step(P, k), and loopfree(k) denote the following formulas:

$$\text{path}(s_0, \ldots, s_k) = Tr(s_0,s_1) \wedge Tr(s_1,s_2) \wedge \ldots \wedge Tr(s_{k-1},s_k) \quad (1)$$

$$\text{base}(P, k) = I(s_0) \wedge \text{path}(s_0, \ldots, s_k) \wedge P(s_0) \wedge \ldots \wedge P(s_{k-1}) \wedge \neg P(s_k) \quad (2)$$

$$\text{step}(P,k) = \text{path}(s_0, \ldots, s_{k+1}) \wedge P(s_0) \wedge \ldots \wedge P(s_k) \wedge \neg P(s_{k+1}) \quad (3)$$

$$\text{loopFree}(k) = \text{path}(s_0, \ldots, s_k) \wedge (\wedge 0 \leq i < j \leq k (s_i \neq s_j)) \quad (4)$$

where Tr is a transition relation between states $s_0, s_1, \ldots$ of a finite state machine, M, and $I(s_0)$ denotes that $s_0$ is an initial state of M, Tr(x,y) indicates that x is related to y by the transition relation, Tr. The formula (1) defines what it means for a sequence of states to be a path through the transition relation. The formula (2) is a so-called "base formula"—when formula (2) is satisfiable, the satisfying assignment exposes a failure of the property, P: the satisfying assignment may be seen as a path in the PSM from an initial state to a state where P is false. The formula (3) is a "step formula"—when the formula (3) is unsatisfiable, the induction step has been proven and P is proven valid (provided a previous base check has shown that P has no CE until depth k). The formula (4) defines a loop-free designation, ensuring that every element of the path is distinct.

A pseudo-code representation of an induction algorithm 300 for a property, P, looks as follows:

```
induction(P,maxdepth) {
  k = 0;
  while (k ≤ maxdepth) {
    If (satisfiable (base(P,k)) {
      Return "P is falsifiable (counter-example length is k)";
    }
    If (unsatisfiable (step(P,k) && loopFree(k)) {
      Return "P is valid";
    }
    k++;
  }
  Return "P has no counter-example of length maxdepth or less";
}
```

Figure 6:
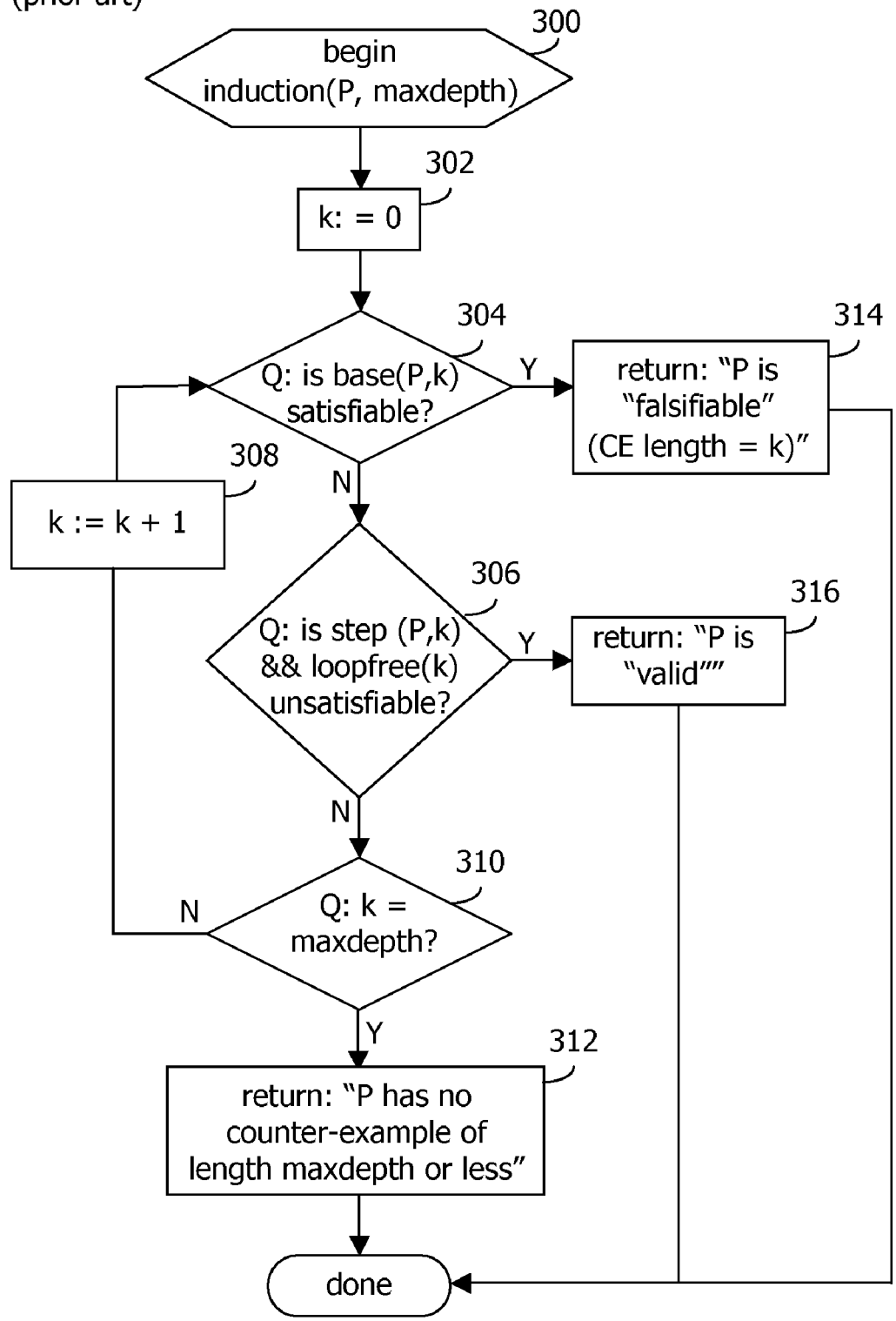
FIG. 6 is a flow diagram depicting an induction algorithm, according to the prior art.

A flow diagram of the induction algorithm 300 is depicted in FIG. 6, according to the prior art. The induction algorithm 300 for verifying P consists of finding a k such that either base(P,k) is satisfiable (and a CE will be generated) or base (P,i) and step(P,k) are unsatisfiable, for $0 \leq i \leq k$, in which case P is valid at all reachable states.

The induction algorithm 300 begins at depth, k, of zero (block 302). At the depth, k, a determination is made whether base(P,k) is "satisfiable" (block 304) via a call to a SAT solver. If so, the induction algorithm 300 returns, "P is falsifiable" with counter-example, CE, of length, k (block 314). If not, then if the conjunction, step(P,k) a loopfree(k) is unsatisfiable (block 306), then the induction algorithm 300 returns, "P is valid"" (block 316). Otherwise, the depth, k, is incremented (block 308) and the process is repeated until k reaches the maximum depth, maxdepth (block 310), at which point the induction algorithm 300 returns "P has no counter-example of length maxdepth or less" (block 312).

The induction algorithm depicted may be varied. For example, the basic checks may be combined with step checks in several different ways. Further, in the basic algorithm, the depth, k, is incremented by one. Larger increments are possible by using slight modifications of the base and step formulas.

The Previous Work on Simultaneous Induction

In typical industrial model checking applications, a number of properties are to be proven on the same model (that is, on the same transition system, or on the same FSM). Since several properties may share the "cone of influence" in the model, proving and disproving several properties in one model-checking session may yield a significant speedup. One approach, an extension to the classic BMC and the induction method, allows the SAT solver to simultaneously check a numb& of safety properties, $P_1, \ldots, P_n$, on the same model.

In the algorithm, a conjunction, P, is formed from the properties, $P_j$. If P is "false" at depth zero, a counter-example, CE, to P is a CE for a number of properties, $P_j$. These $P_j$ are reported "falsifiable" (at depth zero), and remaining properties will form a conjunction, P'. Similarly, the process is applied to property, P', repeatedly, until the maximum subset of properties whose conjunction is not "falsifiable" at depth zero is found. To perform BMC, such properties are checked for depth one in a similar fashion, and so on. The BMC check terminates when all properties are concluded to be "falsifiable" or the depth limit is reached.

For the step, the idea is similar: to find a maximal subset, V, of yet unresolved properties whose conjunction, P*, may be proven at current depth, k. In other words, the corresponding step formula, step(P*,k) is found "unsatisfiable." The subset, V, is found after several iterations of SAT, by checking the conjunctions of unresolved properties and eliminating properties that may not be proven at depth, k, by inspecting the models returned by the SAT solver.

Figure 7:
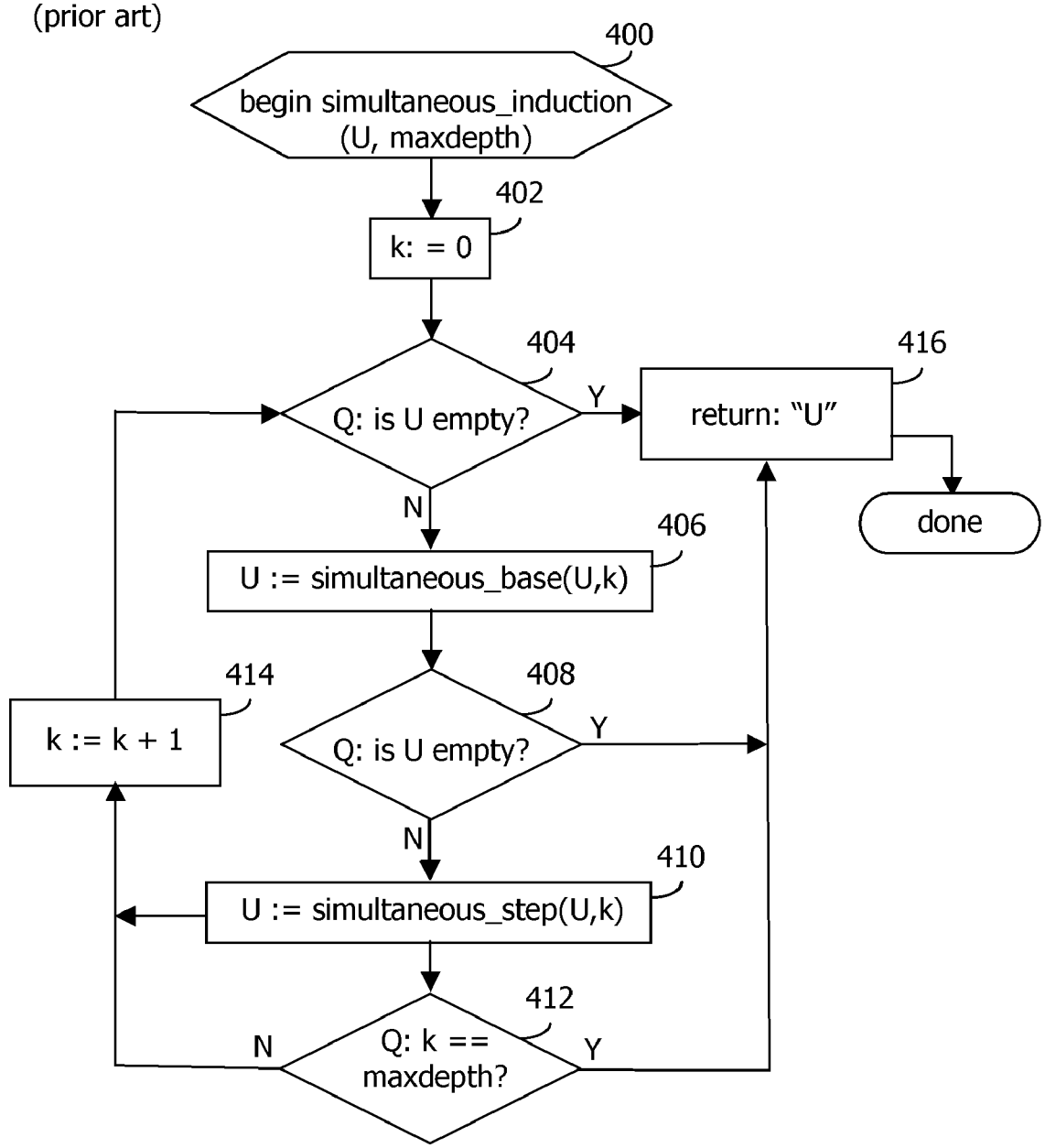
FIG. 7 is a flow diagram depicting a simultaneous induction algorithm, according to the prior art.

FIG. 7 is a flow diagram describing an induction algorithm for multiple safety properties, deemed simultaneous induction 400, according to the prior art. Simultaneous induction 400 introduces two additional terms. U denotes the list of safety properties to be resolved at depth, k. V denotes the list of safety properties that may still be proven valid at depth, k. As will be shown, the contents of U and V change during the course of executing simultaneous_induction 400. Callbacks may be used to report the status of the properties. The callbacks may or may not be mentioned explicitly in the flow diagrams. Each algorithm returns the list of unresolved properties, those remaining from the input property list.

A pseudo-code representation of the simultaneous induction algorithm 400 is as follows:

```
simultaneous_induction(U,maxdepth) {
  k = 0;
  while (k ≤ maxdepth && U != Ø) {
    U = simultaneous_base(U,k);
    If (U != Ø)
      U = simultaneous_step(U,k);
    k++;
  }
  Return U;
}
```

The flow diagram 400 for simultaneous induction 400 begins at depth, k, of zero (block 402). If U, the list of safety properties to be resolved, is empty (block 404), then the list, U, is reported (block 416). Otherwise, U is updated by executing a base induction routine, denoted simultaneous_base(U, k) (block 406). The routine, simultaneous_base(U,k) checks which of the properties in U are "falsifiable" in the SAT instance at depth, k. One version of simultaneous_base in the prior art, called base_conjunction(U,k), is described below. With each execution of simultaneous_base (at different depths, k), the contents of U may change.

Again, a query is made whether the list of safety properties to be resolved, U, is empty (block 408). If so, U is reported (block 416). Otherwise, U is updated by executing the routine, simultaneous_step(U,k) (block 410). The routine, simultaneous_step(U,k) proves some of the properties in U valid and returns an updated version of U containing the remaining, yet unresolved, properties. One version of simultaneous_step in the prior art, known as step_conjunction(U,k), is described below. If the depth has not reached the maximum depth, maxdepth (block 412), the depth, k, is incremented (block 414), and the process is repeated.

In simultaneous_induction(U, maxdepth), for a depth k, the algorithm, simultaneous_base(U,k), checks which of the properties in U are "falsifiable" in the SAT instance unrolled to depth k. One version of simultaneous_base in the prior art corresponds to the procedure, base_conjunction(U,k). A pseudo-code representation of a base_conjunction(U,k) operation is as follows:

```
base_conjunction(U,k) {
  P = ^U;
  while ( U != Ø) {
    If (satisfiable(base(P,k))) {
      U = base_conj_callback( M );
      P = ^U; }
    else {
      break; }
  }
  return U;
}
```

The routine, base_conj_callback(M) uses argument M, which is the model returned by the SAT solver (e.g., the SAT solver 100 in FIG. 2). Base_conj_callback(M) checks M: all properties, $P_j$, in U whose representative variables at depth, k, are false in hi are reported as "falsifiable" at depth k. The list of remaining $P_j$ is saved as U.

Referring back to FIG. 7, a prior art version of simultaneous_induction(U,maxdepth) routine 400 also invokes the routine, step_conjunction(U,k) (block 410). One version of simultaneous_step in the prior art corresponds to the procedure, step_conjunction(U,k). A pseudo-code representation of the step_conjunction(U,k) operation is as follows:

```
step_conjunction(U,k) {
  V = U;
  U = Ø;
  while ( V != Ø) {
    P = ^V;
    If (satisfiable(step(P,k)) {
    (V,U) = step_model_callback(M); }
    else {
      break; }
  }
  valid_callback(V);
  return U;
}
```

As in base_conjunction 500, in step_conjunction 600, M is the model returned by the SAT solver. The procedure, step_model_callback checks which of the variables representing properties in V at depth, k+1, are false in M. Such properties are moved from V to U, as it is known that the properties are not provable at depth, k. The procedure, valid_callback reports all properties in V as "valid," although the list, V, may be empty after step_conjunction 600 terminates.

SSAT-based Induction

FIG. 7, above, describes a simultaneous induction method for multiple safety properties. Also described above are simultaneous base and step algorithms, respectively, used by the prior art version of a simultaneous induction algorithm. These routines are used in conjunction with a SAT solver, such as the SAT solver 100 of FIG. 2. The following induction algorithms are to be used in conjunction with the SSAT solver 200 of FIG. 5, for proving multiple safety properties. In some embodiments, the SSAT implementations described below constitute a significant improvement over the prior art in induction algorithms.

An algorithm for the base part of simultaneous induction to be used with SSAT, known as base_ssat(U,k), is described using pseudo-code below, where $U=\{P_1, \ldots, P_n\}$ is a set of safety properties and $base(U,k)=[base(P_1,k), \ldots, base(P_n,k)]$.

```
base_ssat(U,k) {
    U⁺ = base(U,k);
    U = SSAT⁺(U, U⁺);
    return U;
}
```

The base_seat(U,k) procedure is a way to perform the simultaneous_base (U,k) procedure in the simultaneous_induction routine shown in FIG. 7, above. The base_ssat routine uses the SSAT solver 200.

Figure 8:
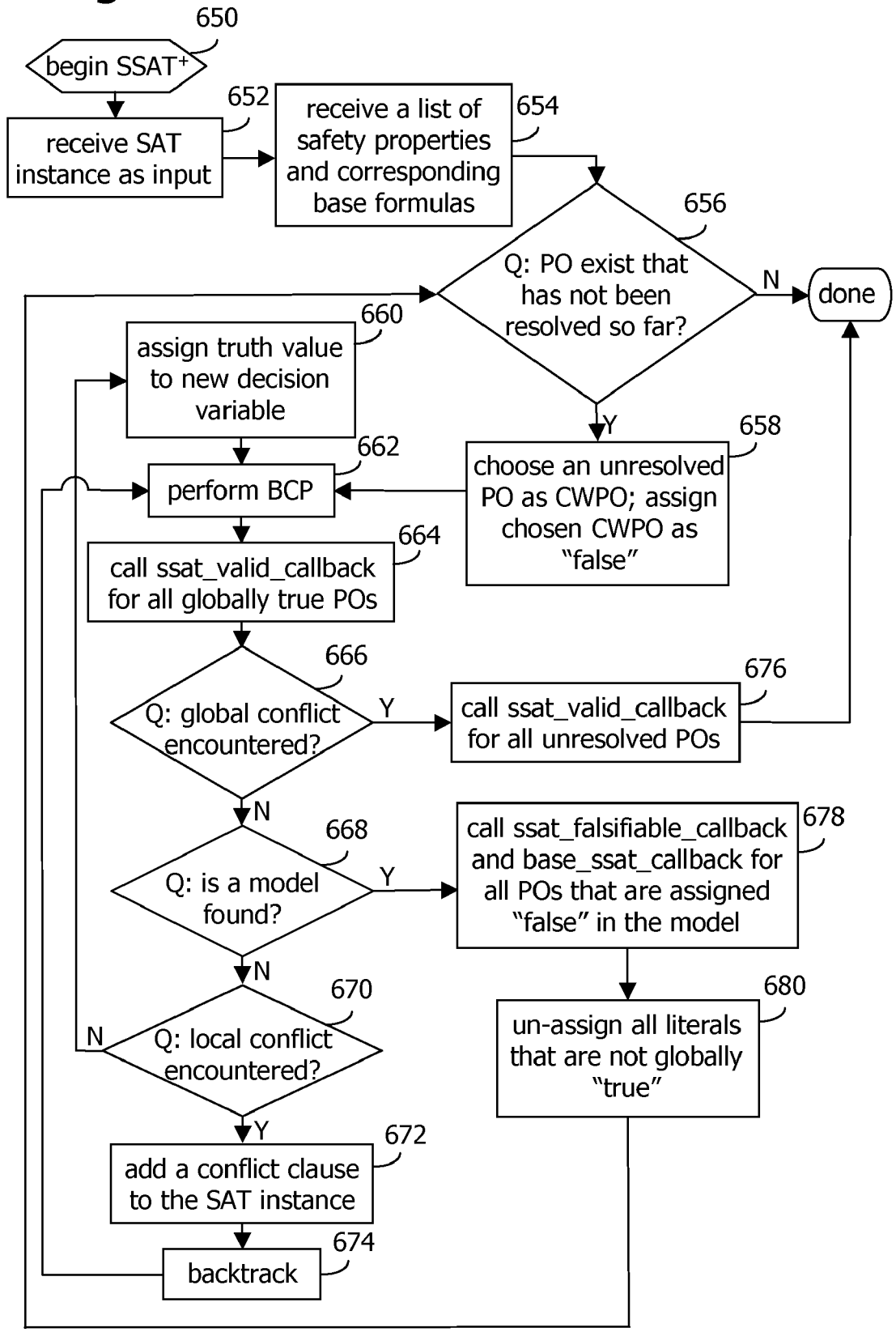
FIG. 8 is a block diagram of a modified SSAT solver, according to some embodiments.

FIG. 8 is a block diagram of a modified SSAT solver, denoted SSAT⁺ solver 650, according to some embodiments. The SSAT⁺ solver operates much like the SSAT solver 200 (FIG. 5). In addition to the SAT instance, SSAT⁺ receives a list of safety properties, U, and receives the literals representing the corresponding base formulas, U⁺, as the PO literals (block 654). (The variables of U⁺ must occur in the SAT instance.) Further, besides calling ssat_falsifiable_callback, the callback, base_ssat_callback, is called for each PO that is assigned "false" in the model (block 678). For each such PO, base_ssat_callback removes the corresponding safety property from the set, U.

Figure 9:
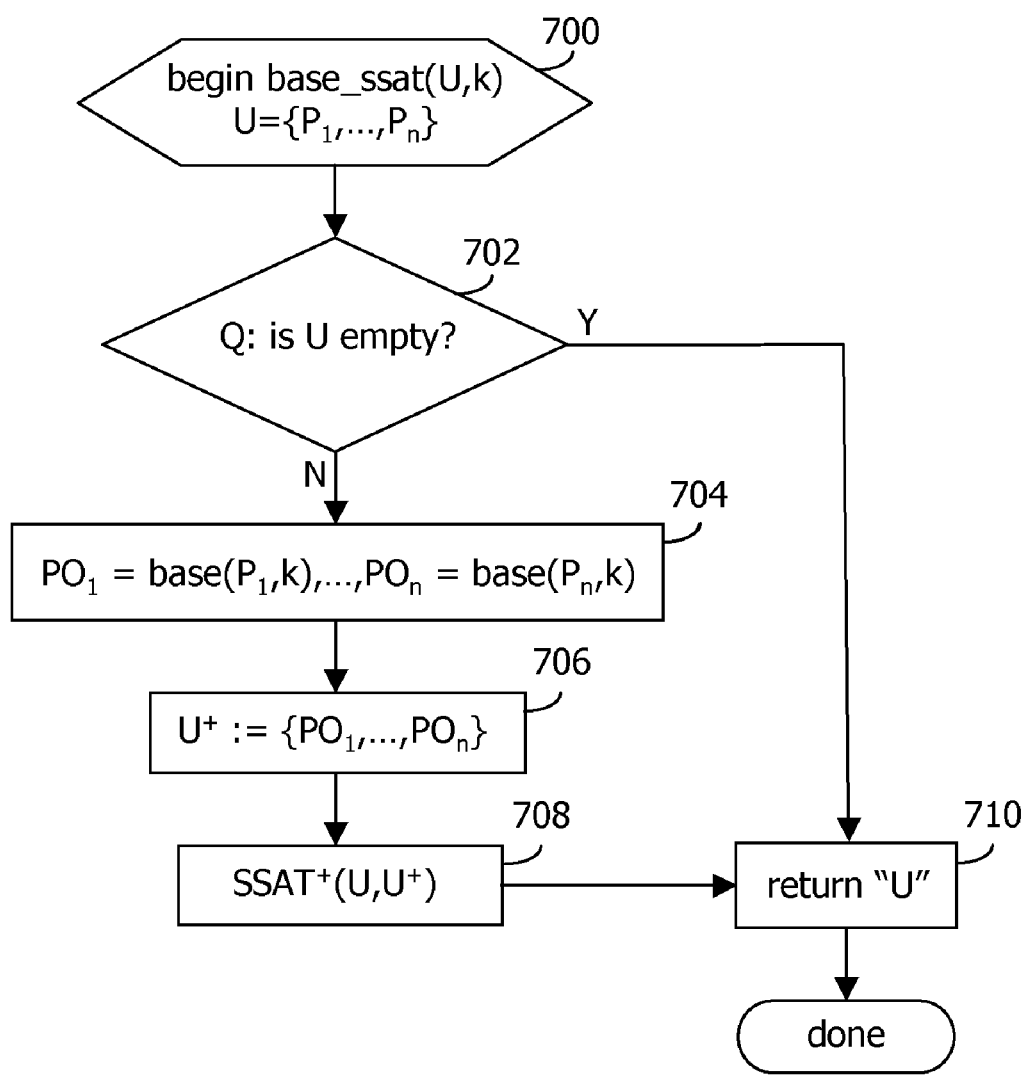
FIG. 9 is a flow diagram depicting operations performed by the base part of the induction algorithm using the modified SSAT solver of FIG. 8, according so some embodiments.

FIG. 9 is a flow diagram describing operation of the base_ssat(U,k) algorithm 700, as also described in the pseudo-code above, according to some embodiments. If the set, U, of safety properties, is not empty (block 702), the algorithm 700 builds the corresponding base formulas, $base(P_1,k), \ldots, base(P_n,k)$ (block 704). The set, U*, is then populated with the corresponding PO literals, $PO_1, \ldots, PO_n$ (block 706), and the SSAT⁺ solver 650 (FIG. 8) is executed (block 708) with the sets, U and U*, as parameters. The set, U, is returned to a caller, as is the case when U is empty (block 710).

To describe a SSAT-based simultaneous step algorithms for multiple safety properties, the following formulas are defined:

$$step(U,k)=[\neg step(P_1,k), \ldots, \neg step(P_n,k)] \quad (5)$$

$$step_2(U,k)=[step_2(U, k, 1), \ldots, step_2(U, k, n)] \quad (6)$$

where both step(U,k) and step(U,k) are lists of formulas. The formula, $step_2(U, k, l)$, is:

$$step_2(U, k, l)=path(s_0, \ldots, s_{k+1}) \wedge P(s_0) \wedge \ldots$$
$$\wedge P(s_k) \rightarrow P_l(s_{k+1}) \quad (7)$$

where $P_l$ is a property in $U=\{P_1, \ldots, P_n\}$ and $P=\wedge U$. The formula, $step_2(U, k, l)$, is called a hybrid step formula for property, $P_l$.

Two methods of performing the simultaneous step operation are described by step_ssat(U,k) and step_hybrid(U,k), according to some embodiments. Pseudo-code for the step_ssat(U,k) algorithm is as follows:

```
step_ssat(U,k) {
    U* = step(U,k);
    SSAT*(U,U*)
    return U;
}
```

Figure 10:
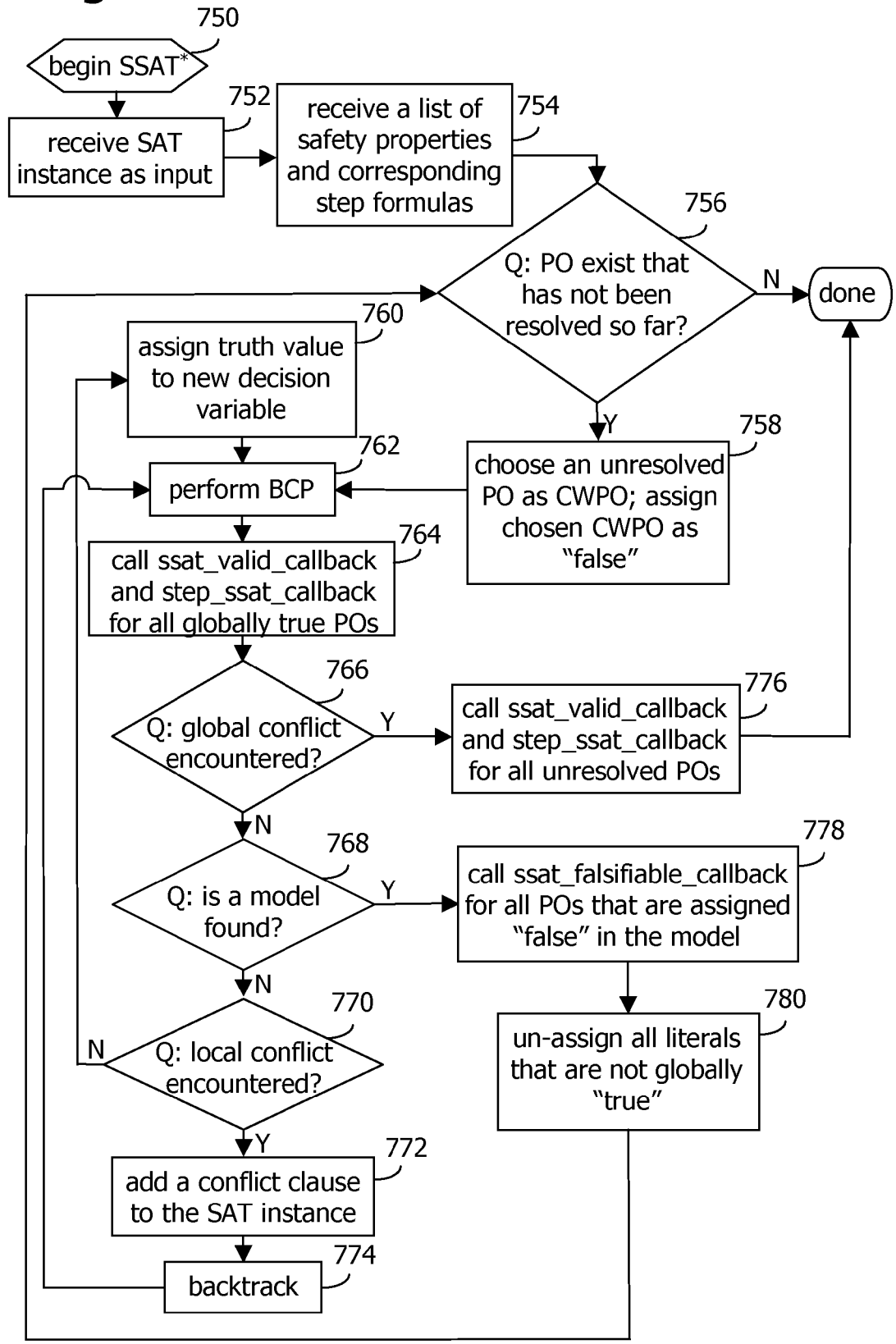
FIG. 10 is a block diagram of a modified SSAT solver, according to some embodiments.

FIG. 10 is a block diagram of a modified SSAT solver, denoted SSAT* solver 750, according to some embodiments. The SSAT* solver 750 operates much like the SSAT solver 200 (FIG. 5). In addition to a SAT instance, the SSAT* solver 750 receives as input a set of safety properties, U, and receives its corresponding set of step formulas, U*, as the PO literals (block 754). (The variables of U* must occur in the SAT instance.) In the SSAT* solver 750, the operations performed are similar to the SSAT solver 200, except that, besides calls being made to ssat_valid_callback (FIG. 5, blocks 214 and 226) and ssat_falsifiable_callback (block 228), calls are made to the callback step_ssat_callback routine as well. In particular, following the performance of BCP (block 762), besides calling the ssat_valid_callback routine, the callback, step_ssat_callback, is called for each globally valid PO (box 764) and all unresolved POs (box 776), respectively. For each such PO, step_ssat_callback reports the corresponding safety property as "valid" and removes it from the set, U.

Figure 11:
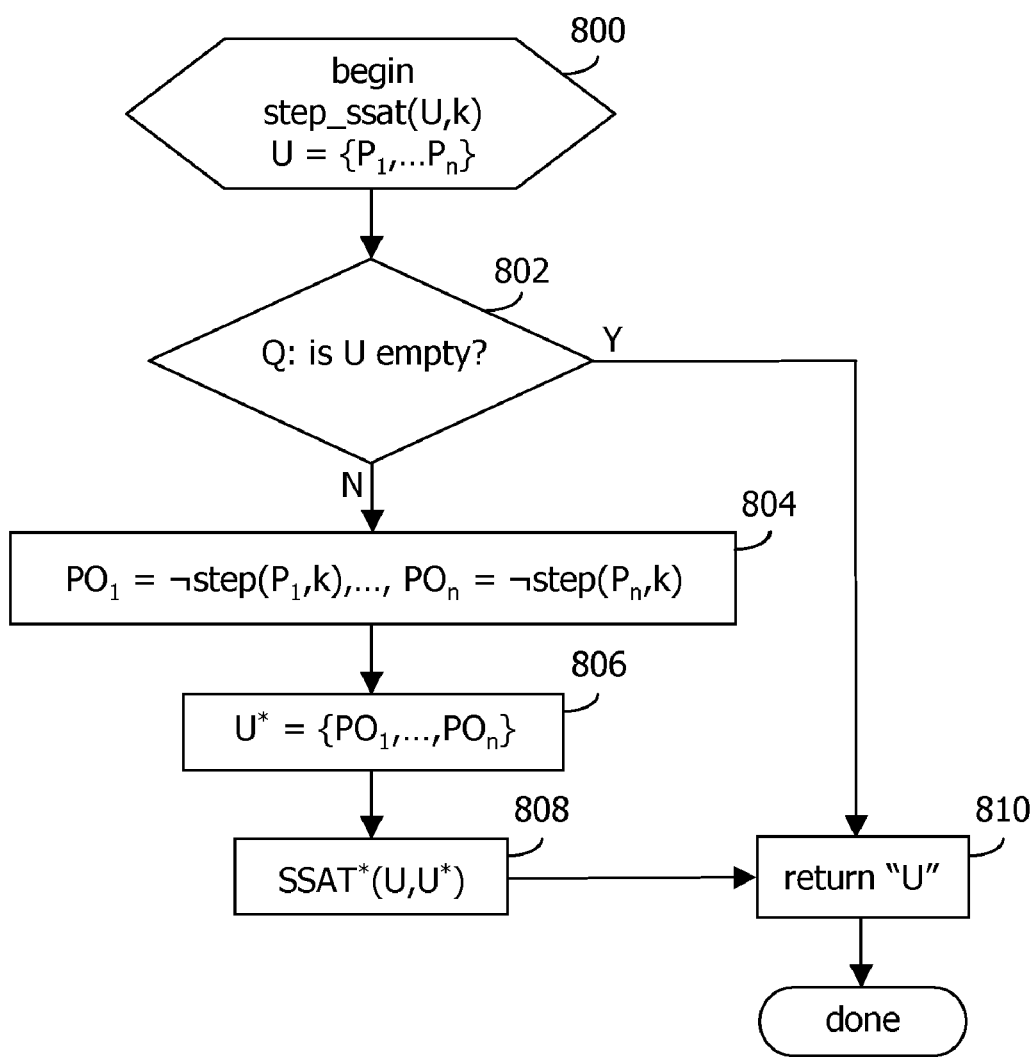
FIG. 11 is a flow diagram depicting operations performed by the step part of the induction algorithm using the modified SSAT solver of FIG. 10, according to some embodiments.

FIG. 11 is a flow diagram showing operation of the step_ssat algorithm, according to some embodiments. If U is not empty (block 802), the algorithm 800 generates the step formulas, $\neg step(P_l,k)$, corresponding to the properties, $P_l$, in U (block 804). The set, U*, is populated with the PO literals corresponding to the above step formulas (block 806). Next, the SSAT* solver 750 (FIG. 10) is executed (block 808) with sets U and U*. The set, U, is returned to a caller, as is the case when U is empty (block 810).

Another SSAT method for simultaneous induction is known as step_hybrid, according to some embodiments. Pseudo-code for the step_hybrid(U,k) algorithm is as follows:

```
step_hybrid(U,k) {
    V = U;
    U = ∅;
    fixpoint_reached = false;
    While (1 fixpoint_reached) {
        U_old = U;
        V** = step₂(V,k)
        SSAT**(V,V**,U)
        if ( U == U_old )
            fixpoint_reached = true;
    }
    valid_callback(V);
    Return U;
}
```

Figure 12:
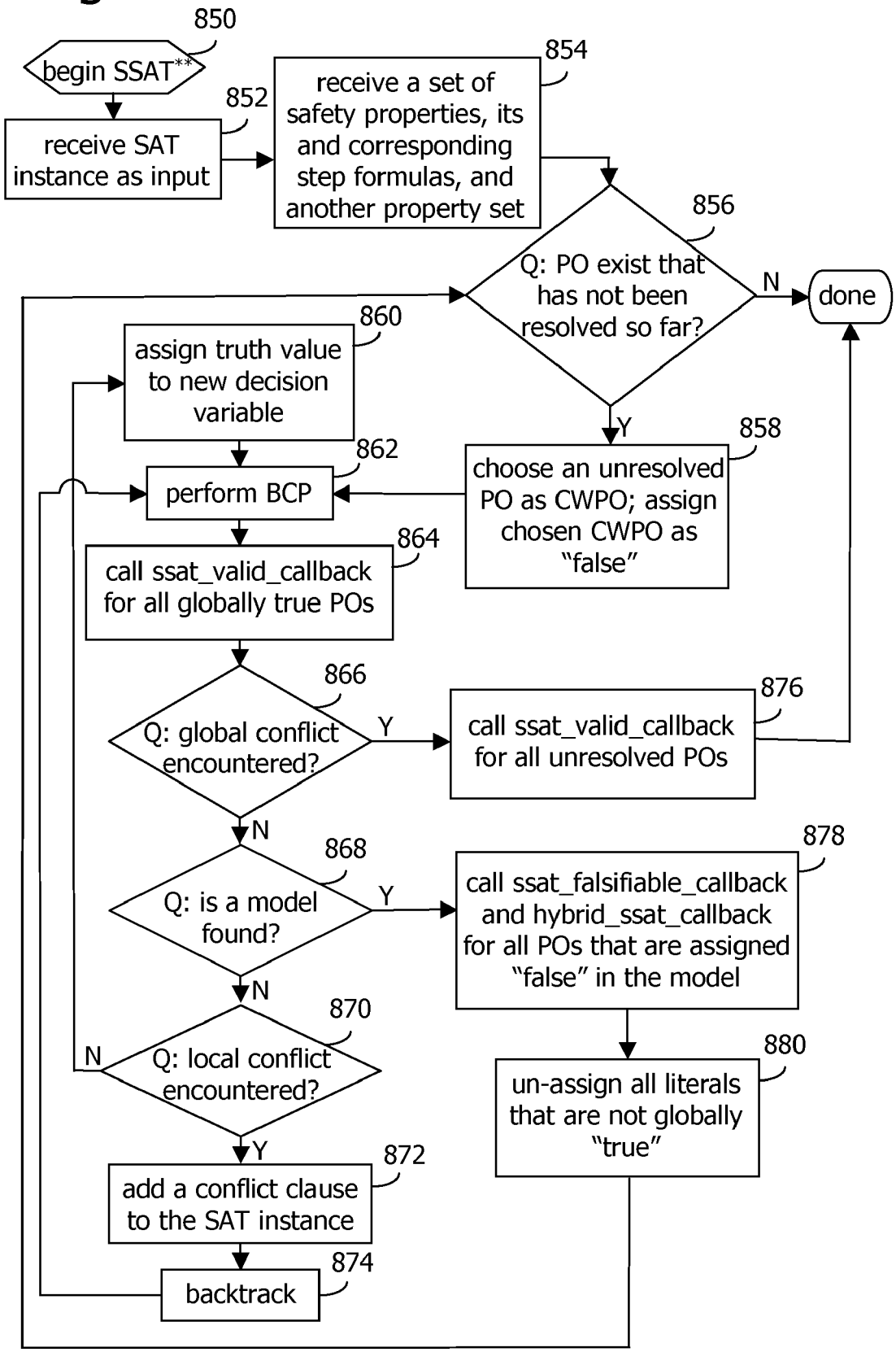
FIG. 12 is a block diagram of a modified SSAT solver, according to some embodiments.

FIG. 12 is a block diagram of another modified SSAT solver, denoted SSAT solver 850, according to some embodiments. The SSAT solver 850 operates much like the SSAT solver 200 (FIG. 5). In addition to a SAT instance, the SSAT solver 850 receives as input a set of safety properties, V; its corresponding set of hybrid step formulas, V, as the PO literals; and another set of safety properties, U (block 854). (The variables of V** must occur in the SAT instance.)

In the SSAT** solver 850, the operations performed are similar to the SSAT solver 200, except that, besides calls being made to ssat_falsifiable_callback (block 228), calls are also made to hybrid_ssat_callback. In particular, besides a call to ssat_falsifiable_callback, a call is made to hybrid_ssat_callback for each PO that is assigned "false" in the model (block 878). For each such PO, the corresponding property is moved from the set, V, to the set, U.

Figure 13:
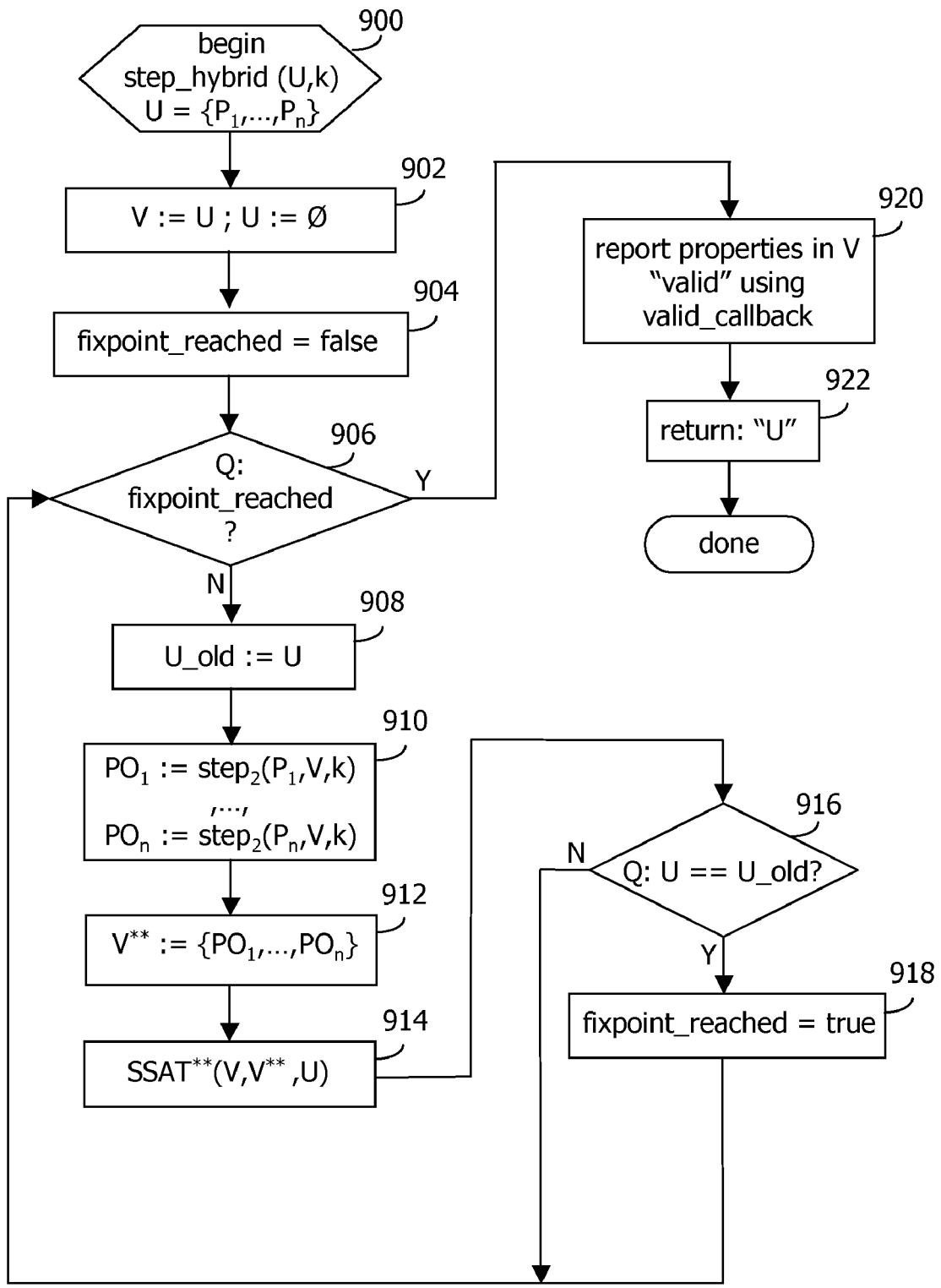
FIG. 13 is a flow diagram depicting operations performed by the step part of the induction algorithm using the modified SSAT solver of FIG. 12, according to some embodiments.

A flow diagram of the algorithm, step_hybrid 900, is depicted in FIG. 13, according to some embodiments. After V and U are initialized as shown (block 902), and variable, fixpoint_reached, is assigned "false" (block 904), the step_hybrid 900 algorithm includes a loop in which, as long as fixpoint_reached is "false" (block 906), U is stored in a temporary location, U_old (block 908). Step formulas, $step_2(V, k)$, are built for each safety property, $P_j$ in V (block 910) and the set, V is populated with the PO literals, $PO_1, \ldots, PO_n$ (block 912). The modified SSAT solver 850 is executed on the sets, V, V**, and U, as described above (block 914), and V and U are updated. The process (steps 908, 910, 912, and 914) is repeated as long as the set, U, is not equal to the temporary set, U_old (block 916). Once the set, U, is the same as the set, U_old, the step_hybrid algorithm 900 sets fixpoint_reached to true (block 918). At this point, all properties in V are reported as "valid," and the remaining properties in U are returned (as unresolved properties).

There are differences between the step_ssat and step_hybrid algorithms. For one thing, step_ssat executes the SSAT solver 200 a single time, while step_hybrid may execute the SSAT solver 200 multiple times. The step_ssat algorithm may therefore be faster than the step_hybrid algorithm. The step_hybrid algorithm, however, operates more analogously to the step_conjunction routine, in that step_hybrid finds the maximal subset of U whose conjunction may be proved at a given depth, k.

The step_hybrid algorithm is different from the step_conjunction algorithm in that the latter uses a SAT solver (e.g., SAT solver 100 in FIG. 2) rather than an SSAT solver. Therefore, the number of calls to the SAT solver in step_conjunction depends on the returned models. Indeed, in general, a part of the variables corresponding to the safety properties that are "falsifiable" under the current step assumption may be assigned "false" in the model returned by the SAT solver. Therefore, in general, step_conjunction needs many more SAT-solving iterations than does step_hybrid, which is advantageous for step_hybrid, in some embodiments.

In the step_ssat algorithm, each unresolved property, $P_j$, is proved without the help of other properties, meaning that $P_j$ at depth k+1 is attempted to prove based on assuming $P_j$ valid at depths, 0 to k. The step_hybrid algorithm (like step_conjunction) uses a stronger assumption that the conjunction of all unresolved properties in U is valid at depths, 0 to k. Thus, step_hybrid may prove more properties at a given depth than step_ssat, according to some embodiments.

Experimental Results

The experimental results using the above algorithms are included in Tables 1 and 2, below, according to some embodiments. The experimental data demonstrates that SSAT as a combinational decision procedure outperforms previous approaches to incremental SAT solving, when called within BMC or induction algorithms to resolve multiple objectives. Further, the SSAT-based induction schemes outperform the previous SAT-based BMC and induction algorithms when verifying multiple safety properties (often tens or hundreds of properties verified together).

There exist at lest two incremental SAT methods. In the first method, a temporal (or local) assumption is made before calling the SAT solver to resolve each particular objective. Therefore, clauses not depending on such local assumptions are safe to re-use during later calls to the SAT solver. Such learned clauses are often called pervasive. This first incremental SAT method is therefore known as pervasive incremental SAT, or PISAT. In the second method, temporal (or local) assumptions are made inside the SAT solver, as part of a SAT search. Therefore, the learned clauses are safe to re-use during later calls to the SAT solver. This method is known as fully incremental SAT, or FISAT.

Just like FISAT, learned clauses in SSAT may be re-used in later calls to the SSAT solver, as long as no new clauses are removed from the CNF instances. Additionally, the SSAT algorithm follows the "one traversal" and "all watched" principles, which the PISAT and FISAT algorithms lack. The "all watched" principle refers to the characteristic in which, while trying to resolve the CWPO, other POs may get resolved as a by-product of conflict analysis. The "one traversal" principle refers to the characteristic in which the entire SAT search space is traversed at most once in order to resolve all the POs.

Table 1, below, is a comparison between PISAT, FISAT, and SSAT, given in seconds. The CNF instances arise mom BMC runs on depths 6-15, and from induction step runs at depths 1 to 10. As shown, the SSAT algorithm performs significantly faster than either PISAT or FISAT.

TABLE 1

SSAT versus incremental SAT approaches.

| BMC depth | PISAT (sec) | FISAT (sec) | SSAT (sec) | Step depth | PISAT (sec) | FISAT (sec) | SSAT (sec) |
|---|---|---|---|---|---|---|---|
| 6 | 174.36 | 9.28 | 2.42 | 1 | 87.42 | 30.3 | 1.99 |
| 7 | 245.51 | 5.41 | 4.68 | 2 | 117.71 | 44.6 | 2.2 |
| 8 | 210.47 | 8.14 | 3.96 | 3 | 170.86 | 62.13 | 3.26 |
| 9 | 316.93 | 2.61 | 2.61 | 4 | 230.31 | 78.97 | 3.92 |
| 10 | 305.79 | 11.79 | 6 | 5 | 291.87 | 97.73 | 5.03 |
| 11 | 508.97 | 14.61 | 11.6 | 6 | 323.46 | 109.5 | 15.93 |
| 12 | 364.76 | 7.68 | 6.69 | 7 | 273.91 | 117.62 | 10.36 |
| 13 | 576.3 | 5.72 | 5.71 | 8 | 292.09 | 117.87 | 8.56 |
| 14 | 424.04 | 11.14 | 11.38 | 9 | 321.43 | 131.28 | 11.03 |
| 15 | 686.75 | 7.96 | 8.05 | 10 | 340.79 | 139.34 | 9.24 |
| Total | 3813.88 | 84.34 | 63.1 | Total | 2449.85 | 929.34 | 71.52 |

Table 2 demonstrates the efficiency of the temporal induction algorithms based on SSAT in contrast to a prior art conjunction method based on SAT, according to some embodiments.

TABLE 2

SSAT and hybrid induction versus prior art induction.

| method/ test | (1) prior art | (2) SSAT induction | (3) hybrid induction | speedup (2) vs (1) | speedup (3) vs (1) |
|---|---|---|---|---|---|
| test 1 | 2777.54 | 200.69 | 237.66 | 13.84 | 11.69 |
| test 2 | 3978.52 | 312.08 | 233.97 | 12.75 | 17.00 |
| test 3 | 18040.21 | 830.61 | 1384.08 | 21.72 | 13.03 |
| test 4 | 31338.58 | 3710.35 | 2148.58 | 8.45 | 14.59 |

Figure 14:
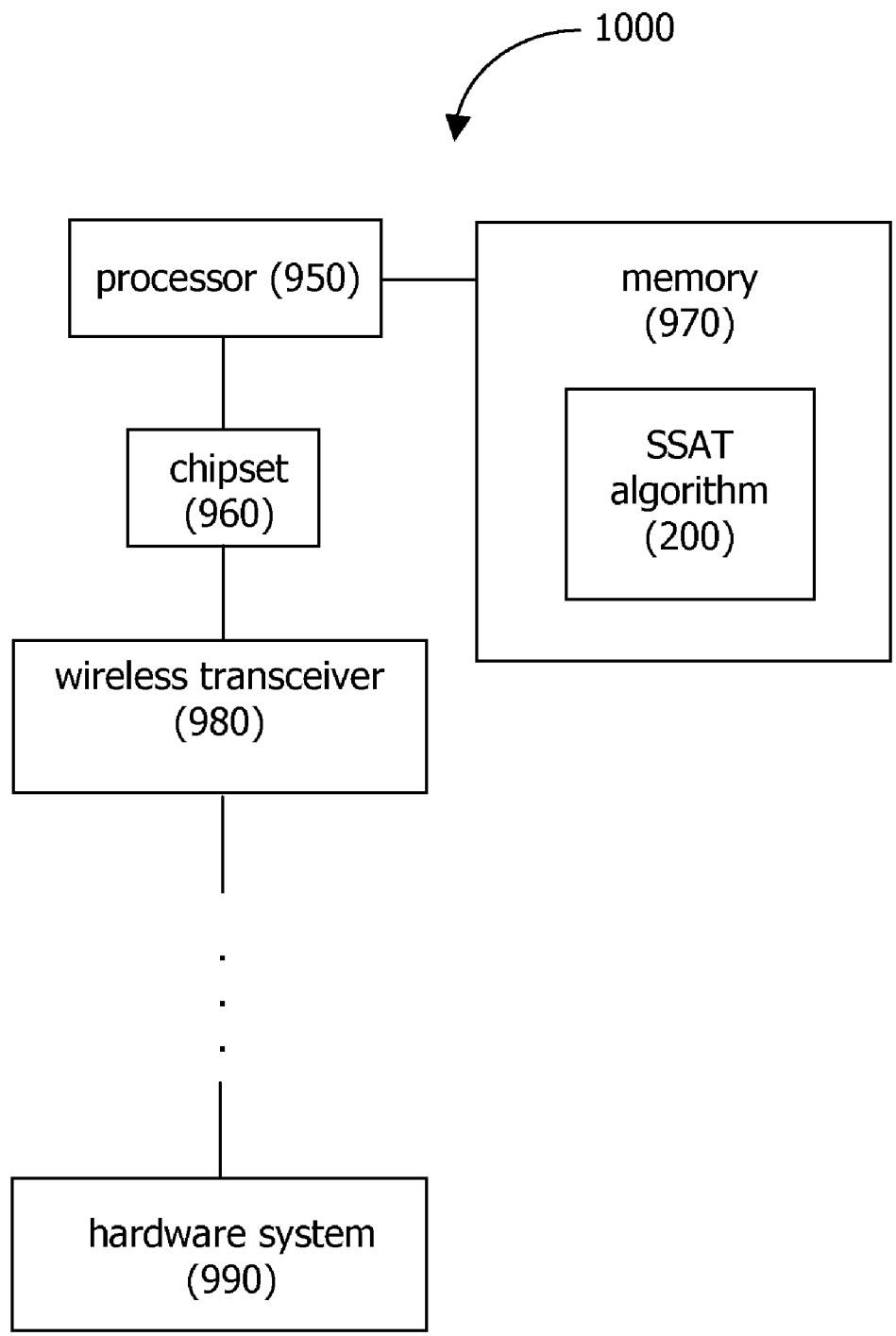
FIG. 14 is a block diagram of a processor-based system utilizing the SSAT algorithm, according to some embodiments.

FIG. 14 is a block diagram of a processor-based system 1000, in which the SSAT algorithm 200 is used to test a hardware system 980, according to some embodiments. The system 1000 includes a processor 950 coupled to a memory 970. The SSAT algorithm 200 is loaded into the memory 970. Also coupled to the processor 950 is a chipset 960, which provides support to a wireless transceiver 980. The hardware system 990 is wirelessly coupled to the wireless transceiver 980, such as at a site remote from the processor-based system 1000. In some embodiments, the SSAT algorithm 200 is executed in the memory 970, in order to test the hardware system 990.

While the specification has been described with respect to a limited number of embodiments, those skilled in the art will appreciate numerous modifications and variations therefrom. It is intended that the appended claims cover all such modifications and variations as fall within the true spirit and scope of the specification. For example, the assumption in the SSAT algorithm that the variables of PO literals must occur in the CNF instance is not a limiting restriction for the SSAT algorithm. Indeed, the validity of a PO whose corresponding variable does not occur in the CNF instance is reduced to the satisfiability of the CNF instance: such a PO is falsifiable if the CNF instance is satisfiable, and is valid otherwise.

We claim:

1. A method for performing design verification of a system, the method comprising:
   receiving a formula comprising a set of clauses, each clause comprising a disjunction of literals;
   receiving a plurality of proof objective literals, each proof objective literal comprising a variable or a negation of the variable, wherein the variable or the negation of the variable occurs in the formula;
   performing operations on a satisfiability search space until no unresolved proof objective literal exists, the operations comprising:
      assigning an unresolved proof objective literal of the plurality of proof objective literals as a currently watched proof objective literal;
      performing Boolean constraint propagation on the formula;
      if a model is found during the Boolean constraint propagation, designating proof objective literals that are assigned false by the model as falsifiable and un-assigning literals of the formula that are not globally true; and
      designating globally true proof objective literals as valid proof objective literals;
   wherein the above steps of the method are executed by a processor-based system to perform the system design verification.

2. The method of claim 1, the performing operations until no unresolved proof objective literal exists further comprising:
   determining whether a global conflict is encountered during the Boolean constraint propagation; and, if so,
   designating unresolved proof objective literals as valid.

3. The method of claim 2, the performing operations until no unresolved proof objective literal exists further comprising:
   determining whether a local conflict is encountered during the Boolean constraint propagation; if so:
      adding a conflict clause to the formula; and
      backtracking prior to subsequently performing the Boolean constraint propagation.

4. The method of claim 3, the backtracking prior to subsequently performing the Boolean constraint propagation further comprising:
   un-assigning one or more of the assigned variables of the formula.

5. The method of claim 1, receiving a formula comprising a set of clauses further comprising:
   receiving the formula written in conjunctive normal form.

6. A method to formally verify a finite state machine using a base part of an induction algorithm, the method comprising:
   receiving a set of safety properties describing an intended behavior of the finite state machine;
   receiving a depth parameter, wherein the depth parameter is a non-negative integer; and
   unless the set is empty:
      generating a plurality of proof objective literals using base formulas for the depth parameter, each base formula corresponding to a safety property in the set;
      building a second set comprising the plurality of proof objective literals;
      executing a simultaneous satisfiability algorithm, using the set and the second set as parameters, wherein the simultaneous satisfiability algorithm reports falsifiable safety properties from the set to a caller, wherein the falsifiable
   safety properties are safety properties whose corresponding proof objective literals are proven falsifiable by the simultaneous satisfiability algorithm;
wherein the method operations are executed from within a memory of a processor-based system to verify the finite state machine.

7. The method of claim 6, further comprising:
removing the falsifiable safety properties from the set.

8. The method of claim 7, further comprising:
reporting the set to the caller as unresolved properties.

9. A method to formally verify a finite state machine using a step part of an induction algorithm, the method comprising:
   receiving a set of safety properties describing an intended behavior of the finite state machine;
   receiving a depth parameter, wherein the depth parameter is a non-negative integer; and
   unless the set is empty:
      generating a plurality of proof objective literals using step formulas for the
   depth parameter, each step formula corresponding to a safety property in the set;
      building a second set comprising the plurality of proof objective literals;
      executing a simultaneous satisfiability algorithm, using the set and the second set as parameters, wherein the simultaneous satisfiability algorithm designates proven safety properties from the set as valid, wherein the proven safety properties are safety properties whose corresponding proof objective literals are proven valid by the simultaneous satisfiability algorithm; and
      reporting the valid safety properties to a caller;
wherein the method is executed from a processor-based system coupled to the finite state machine.

10. The method of claim 9, further comprising:
removing the valid safety properties from the set.

11. The method of claim 10, further comprising:
reporting the set to the caller as unresolved properties.

12. A method to formally verify a finite state machine using a step part of an induction algorithm, the method comprising:
   receiving a set of safety properties describing an intended behavior of the finite state machine;
   receiving a depth parameter, wherein the depth parameter is a non-negative integer;
   moving the set to a second set and emptying the set; and
   until a Boolean variable, initially assigned false, is true, performing the operations:
      moving the set of safety properties to a third set;
      generating a plurality of proof objective literals using hybrid step formulas for the depth parameter, each hybrid step formula corresponding to a safety property in the set, the plurality of proof objective literals occupying a fourth set;

executing a simultaneous satisfiability algorithm, using the second set, the fourth set, and the set as parameters, wherein the simultaneous satisfiability algorithm updates the set and the second set by moving designated properties from the second set to the set, the designated properties being those properties that cannot be proven valid for the depth parameter since their corresponding proof objective literals are proven falsifiable by the simultaneous satisfiability algorithm; and if the third set equals the set as a result of the update to the set, setting the Boolean variable to be true;

wherein the above method steps are executed on a processor-based system coupled to the finite state machine.

13. The method of claim 12, further comprising:
reporting the properties in the second set as valid; and
reporting the set to a caller as unresolved properties.

14. A processor-based system, comprising:
a processor;
a memory coupled to the processor, the memory comprising a simultaneous satisfiability algorithm stored therein;
a chipset coupled to the processor and a wireless transceiver, wherein the wireless transceiver is remotely coupled to a hardware system;

wherein the simultaneous satisfiability algorithm performs the following operations:
receiving a formula comprising a set of clauses, each clause comprising a disjunction of literals;
receiving a plurality of proof objective literals, each proof objective literal comprising a variable or a negation of the variable, wherein the variable or the negation of the variable occurs in the formula; and performing additional operations on a satisfiability search space until no unresolved proof objective literal exists, wherein the additional operations comprise:
assigning an unresolved proof objective literal of the plurality of proof objective literals as a currently watched proof objective literal;
performing Boolean constraint propagation on the formula;
if a model is found during the Boolean constraint propagation, designating the proof objective literals that are assigned false by the model as falsifiable and un-assigning literals of the formula that are not globally true; and
designating globally true proof objective literals as valid proof objective literals.

15. The processor-based system of claim 14, wherein the simultaneous satisfiability algorithm further:
determines whether a global conflict is encountered during the Boolean constraint propagation; and, if so,
designates unresolved proof objective literals as valid.

16. The processor-based system of claim 15, wherein the simultaneous satisfiability algorithm further:
determines whether a local conflict is encountered during the Boolean constraint propagation; if so:
adds a conflict clause to the formula; and
backtracks prior to subsequently performing Boolean constraint propagation.

17. The processor-based system of claim 16, wherein the simultaneous satisfiability algorithm further:
un-assigns one or more of the assigned variables of the formula.

* * * * *